(12) United States Patent
Kamiya

(10) Patent No.: US 12,193,261 B2
(45) Date of Patent: Jan. 7, 2025

(54) DISPLAY DEVICE HAVING A SEALING FILM COVERING A CATHODE

(71) Applicant: Japan Display Inc., Tokyo (JP)

(72) Inventor: Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/387,080

(22) Filed: Nov. 6, 2023

(65) Prior Publication Data

US 2024/0081095 A1  Mar. 7, 2024

Related U.S. Application Data

(63) Continuation of application No. 17/126,167, filed on Dec. 18, 2020, now Pat. No. 11,849,599, which is a
(Continued)

(30) Foreign Application Priority Data

Mar. 15, 2013 (JP) ................. 2013-053469

(51) Int. Cl.
| | |
|---|---|
| *H10K 50/844* | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/828* | (2023.01) |
| *H10K 50/856* | (2023.01) |
| *H10K 59/12* | (2023.01) |
| *H10K 59/122* | (2023.01) |
| *H10K 71/00* | (2023.01) |
| *H10K 50/84* | (2023.01) |
| *H10K 101/10* | (2023.01) |

(52) U.S. Cl.
CPC .......... *H10K 50/844* (2023.02); *H10K 50/11* (2023.02); *H10K 50/15* (2023.02); *H10K 50/16* (2023.02); *H10K 50/17* (2023.02); *H10K 50/171* (2023.02); *H10K 50/828* (2023.02); *H10K 50/856* (2023.02); *H10K 59/12* (2023.02); *H10K 59/122* (2023.02); *H10K 71/00* (2023.02); *H10K 50/84* (2023.02); *H10K 2101/10* (2023.02)

(58) Field of Classification Search
CPC .................................................. H10K 50/844
See application file for complete search history.

(56) References Cited

U.S. PATENT DOCUMENTS

| | | | | |
|---|---|---|---|---|
| 2007/0132381 | A1* | 6/2007 | Hayashi | H10K 59/871 313/512 |
| 2011/0024780 | A1* | 2/2011 | Park | H10K 50/84 257/98 |
| 2013/0161680 | A1* | 6/2013 | Oh | H10K 50/8445 438/46 |

FOREIGN PATENT DOCUMENTS

JP   2007250370 A  *  9/2007

* cited by examiner

*Primary Examiner* — Peter Bradford
(74) *Attorney, Agent, or Firm* — Michael Best & Friedrich LLP

(57) ABSTRACT

The organic electroluminescence display device of an embodiment of the present invention includes a substrate, a plurality of pixels formed on the substrate, and a sealing film that covers the plurality of pixels. The sealing film includes a first barrier layer, a base layer covering the top surface of the first barrier layer, an inter layer locally formed on the top surface of the base layer, and a second barrier layer covering the top surface of the base layer and the top surface of the inter layer. The inter layer is formed so as to cover a step on the top surface of the base layer.

3 Claims, 11 Drawing Sheets

Related U.S. Application Data continuation of application No. 16/872,648, filed on May 12, 2020, now Pat. No. 10,903,449, which is a continuation of application No. 16/431,075, filed on Jun. 4, 2019, now Pat. No. 10,693,106, which is a continuation of application No. 15/728,993, filed on Oct. 10, 2017, now Pat. No. 10,367,167, which is a continuation of application No. 15/335,525, filed on Oct. 27, 2016, now Pat. No. 9,818,979, which is a continuation of application No. 14/847,869, filed on Sep. 8, 2015, now Pat. No. 9,515,289, which is a continuation of application No. 14/210,907, filed on Mar. 14, 2014, now Pat. No. 9,159,951.

DISPLAY DEVICE HAVING A SEALING FILM COVERING A CATHODE

CROSS-REFERENCE TO RELATED APPLICATIONS

This application is a continuation of U.S. application Ser. No. 17/126,167 filed on Dec. 18, 2020, which, in turn, is a continuation of U.S. application Ser. No. 16/872,648 (now U.S. Pat. No. 10,903,449) filed on May 12, 2020, which, in turn, is a continuation of U.S. application Ser. No. 16/431,075 (now U.S. Pat. No. 10,693,106) filed on Jun. 4, 2019, which, in turn, is a continuation of U.S. application Ser. No. 15/728,993 (now U.S. Pat. No. 10,367,167) filed on Oct. 10, 2017, which, in turn, is a continuation of U.S. application Ser. No. 15/335,525 (now U.S. Pat. No. 9,818,979) filed on Oct. 27, 2016, which, in turn, is a continuation of U.S. application Ser. No. 14/847,869 (now U.S. Pat. No. 9,515,289) filed on Sep. 8, 2015, which, in turn, is a continuation of Ser. No. 14/210,907 (now U.S. Pat. No. 9,159,951) filed on Mar. 14, 2014. Further, this application claims priority from Japanese Application JP 2013-53469 filed on Mar. 15, 2013, the entire contents of which are hereby incorporated by reference into this application.

BACKGROUND OF THE INVENTION

1. Field of the Invention

The present invention relates to organic electroluminescence display devices, and organic electroluminescence display device manufacturing methods.

2. Description of the Related Art

The organic electroluminescence light-emitting element has attracted interest as a thin, light-weight luminescent source, and image display devices provided with large numbers of organic electroluminescence light-emitting elements have been developed. Such an organic electroluminescence light-emitting element is structured to include an organic layer having a light-emitting layer, and the organic layer is sandwiched between an anode and a cathode.

An organic electroluminescence display device configured to include a sealing film that covers the top surface of an organic layer is proposed. The sealing film is provided as a laminate of a planarizing decoupling layer, and a barrier layer that prevents entry of moisture. The outer edge of the decoupling layer is also covered with the barrier layer.

In the configuration of related art, there is a possibility of moisture permeating into the decoupling layer when the barrier layer covering the top surface of the decoupling layer is damaged by, for example, scratch. Further, any irregularities formed in the top surface of the decoupling layer prevent deposition of the barrier layer around these irregularities during the formation of the barrier layer. This may cause moisture permeation in the decoupling layer through the areas around the irregularities.

The sealing film is commonly provided for a plurality of pixels, and accordingly any moisture permeating the decoupling layer diffuses over a plurality of pixels. The decoupling layer affected by the moisture diffusion swells, and detaches itself from the barrier layer. This causes problems such as low luminance and low strength in the organic electroluminescence display device. Indeed, it has been difficult to improve the brightness and the reliability of an organic electroluminescence display device.

SUMMARY OF THE INVENTION

The present invention has been made under these circumstances, and it is an object of the present invention to provide an organic electroluminescence display device having improved brightness and reliability.

(1) An organic electroluminescence display device according to an aspect of the present invention includes:
   a substrate;
   a plurality of pixels formed on the substrate; and
   a sealing film that covers the plurality of pixels, and that includes:
      a first barrier layer;
      a base layer that covers a top surface of the first barrier layer;
      an inter layer locally formed on a top surface of the base layer; and
      a second barrier layer that covers the top surface of the base layer and a top surface of the inter layer,
      wherein the inter layer is formed so as to cover a step on the top surface of the base layer.

(2) In the organic electroluminescence display device of (1), the inter layer formed in the plurality of pixels may be separated from one another between adjacent pixels.

(3) In the organic electroluminescence display device of (1) or (2), the inter layer may be made of organic material.

(4) In the organic electroluminescence display device of (1) or (2), the first barrier layer may be made of Si.

(5) In the organic electroluminescence display device of (1) or (2), the second barrier layer may be made of Si.

(6) An organic electroluminescence display device according to another aspect of the present invention includes pixels formed on a substrate, the pixels each including:
   a thin film transistor;
   a pixel electrode controlled by the thin film transistor;
   an organic layer disposed on the pixel electrode; and
   a counter electrode disposed on the organic layer,
   wherein the pixels are covered with a sealing film, and
   wherein the sealing film on the pixels includes:
      a first region where a first barrier layer, a base layer, and a second barrier layer are laminated; and
      a second region where the first barrier layer, the base layer, an inter layer, and the second barrier layer are laminated.

(7) In the organic electroluminescence display device of (6), the pixel electrode may have an end portion covered with a pixel isolation film, the first region may overlie an emission region of the pixel, and the second region may partially overlie the pixel isolation film.

(8) In the organic electroluminescence display device of (6), the pixel electrode may have an end portion covered with a pixel isolation film, and a contact angle of the inter layer with respect to the base film in the emission region may be smaller than a contact angle of the pixel isolation film with respect to the pixel electrode.

(9) A method for manufacturing an organic electroluminescence display device according to another aspect of the present invention includes the steps of:
   forming a plurality of organic electroluminescence light-emitting element on a substrate, the plurality of organic electroluminescence light-emitting elements being formed for each of a plurality of pixels; and forming a sealing film so as to cover the organic electroluminescence light-emitting elements over the plurality of pixels,
wherein the step of forming the sealing film includes the steps of:
forming a first barrier layer;
forming a base layer that covers a top surface of the first barrier layer;
forming an inter layer locally on a top surface of the base layer; and
forming a second barrier layer that covers the top surface of the base layer and a top surface of the inter layer,
wherein the affinity between the material of the base layer and the material of the inter layer is higher than the affinity between the material of the first barrier layer and the material of the inter layer, and
wherein the inter layer formed in the inter layer forming step covers a step created by local protrusion in part of the top surface of the base layer relative to the top surface of the base layer.

(10) In the method of (9), the inter layer formed in the inter layer forming step may be separated from one another between adjacent pixels.

(11) In the method of (9) or (10), the inter layer may be made of organic material.

(12) In the method of (9) or (10), the first barrier layer may be made of Si.

(13) In the method of (9) or (10), the second barrier layer may be made of Si.

DETAILED DESCRIPTION OF THE INVENTION

Figure 1:
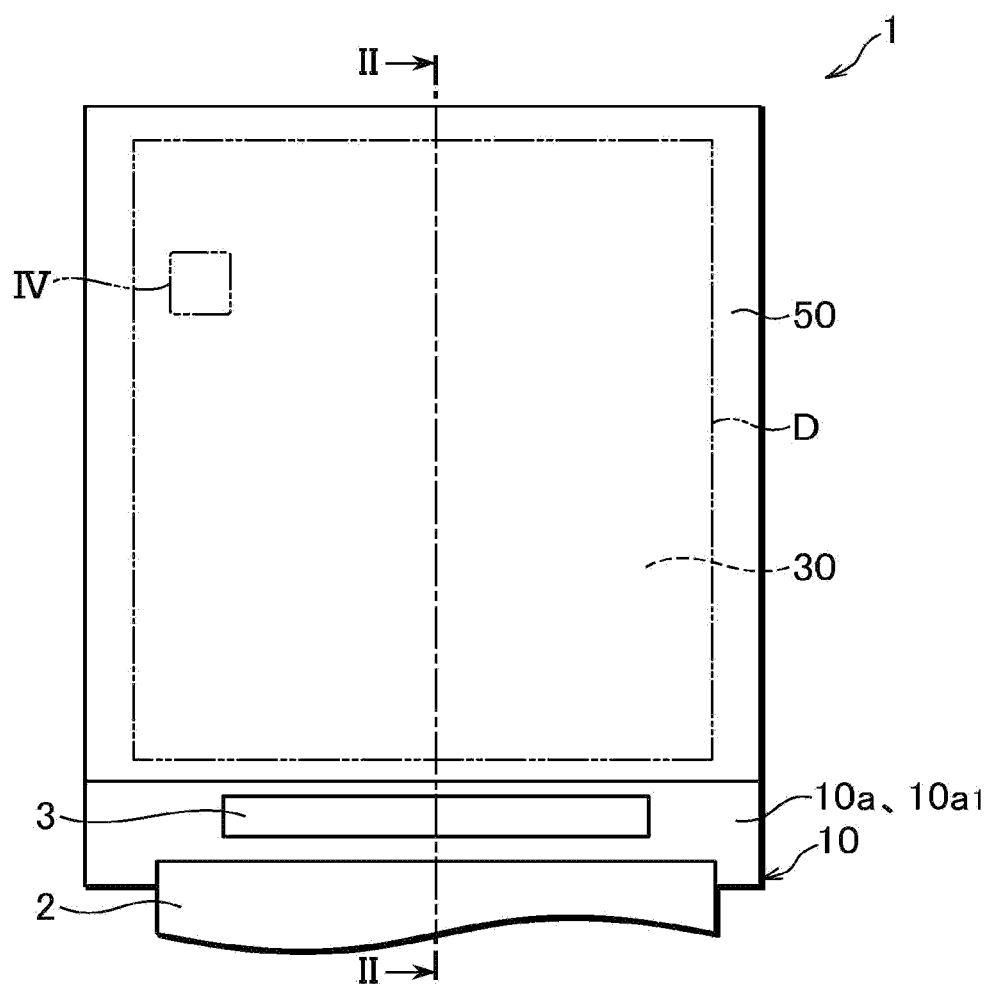
FIG. 1 is a schematic plan view of an organic electroluminescence display device according to an embodiment of the present invention.

An organic electroluminescence display device 1 as an embodiment of the present invention is described below with reference to the accompanying drawings. In the drawings referred to in the following descriptions, certain features may be enlarged for illustrative purposes, and the dimensions of each constituting element do not necessarily reflect the actual scale. Further, materials and other features exemplified in the following descriptions are presented for merely illustrative purposes, and each constituting element is not limited to what is described below, and may be applied in many variations within the gist of the present invention.

Figure 2:
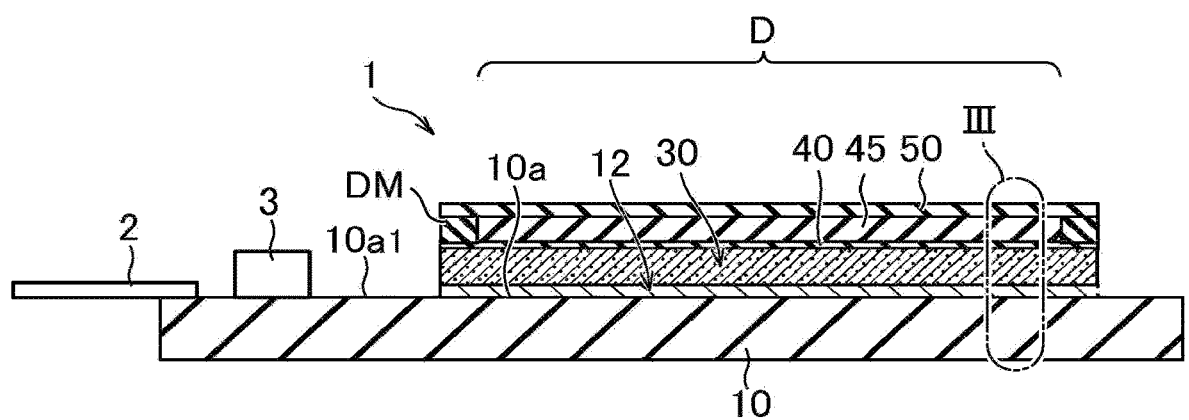
FIG. 2 is a schematic cross sectional view of the organic electroluminescence display device of FIG. 1 at line II-II.

FIG. 1 is a schematic plan view of the organic electroluminescence display device 1 according to the embodiment of the present invention. FIG. 2 is a schematic cross sectional view of the organic electroluminescence display device 1 of FIG. 1 at line II-II.

As illustrated in FIG. 2, the organic electroluminescence display device 1 according to the present embodiment includes a substrate 10, a circuit layer 12, an organic electroluminescence light-emitting element 30, a sealing film 40, and a counter substrate 50 disposed on the sealing film 40 via a filler 45.

The substrate 10 is an insulating substrate, and has a top surface 10a on which a thin film transistor 11 (described later), and the organic electroluminescence light-emitting element 30 are formed. The organic electroluminescence light-emitting element 30 is provided above the top surface 10a of the substrate 10. Note that the organic electroluminescence light-emitting element 30 shown in the figure is one of a plurality of organic electroluminescence light-emitting elements 30 provided above the top surface 10a of the substrate 10, and is not detailed in FIG. 2 for convenience of explanation.

As illustrated in FIG. 1, the organic electroluminescence light-emitting element 30 is provided, for example, in a display region D having a smaller outer perimeter than the substrate 10 in planar view. A blockade DM for blocking the filler 45 is disposed in an outer region of the display region D, for example, as illustrated in FIG. 2. Wires such as control signal lines, data signal lines, and power lines (not illustrated) are provided on the substrate 10 in regions corresponding to the display region D. A multiplicity of pixels is orderly disposed in the display region D, for example, in a matrix.

The substrate 10 is connected to a flexible circuit board 2, and a driver 3 is provided in a region 10a1 on the top surface 10a of the substrate 10 where the organic electroluminescence light-emitting element 30 is not formed. The driver 3 receives image data from outside of the organic electroluminescence display device 1 via the flexible circuit board 2. Upon receiving image data, the driver 3 supplies a voltage signal to the organic electroluminescence light-emitting element 30 via data lines (not illustrated), and the voltage signal is applied to each pixel.

Figure 3:
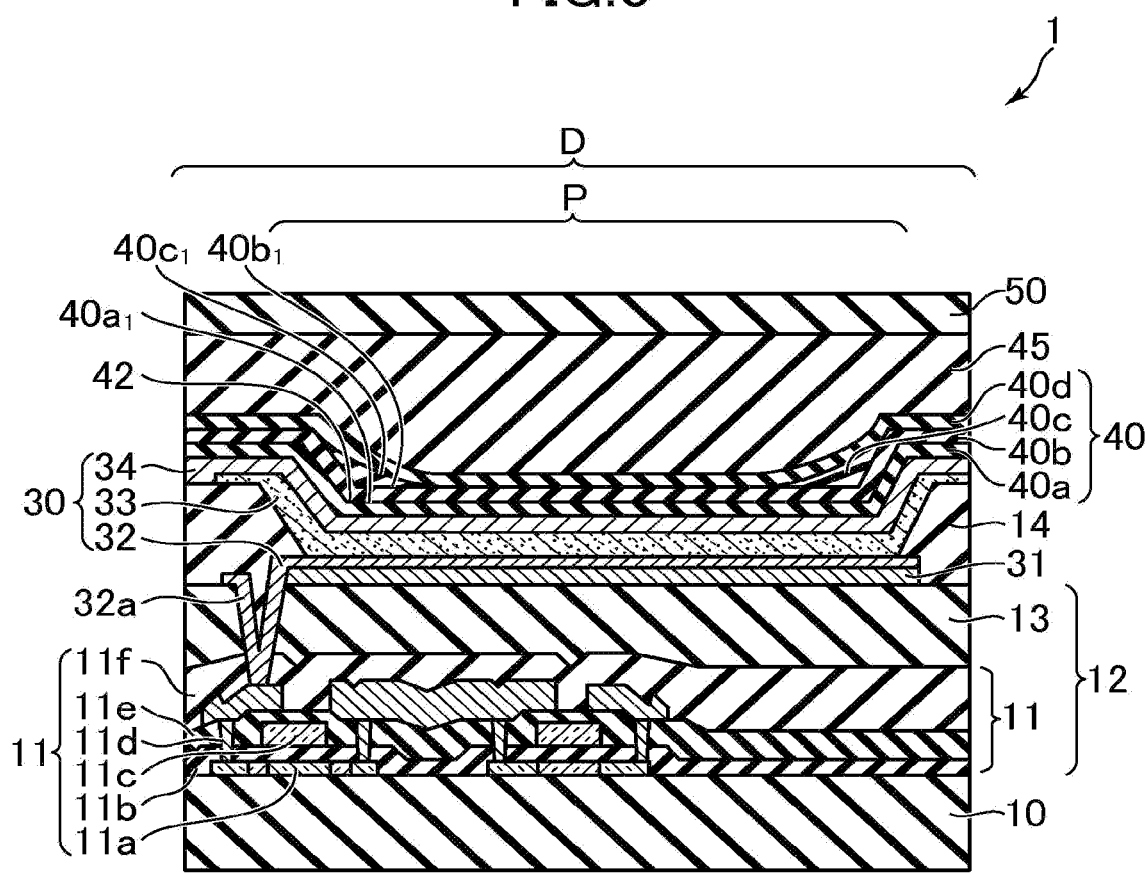
FIG. 3 is a partially magnified view of region III of the organic electroluminescence display device shown in FIG. 2.

The configuration of the display region D of the organic electroluminescence display device 1 is described below in greater detail. FIG. 3 is a partially magnified view of region III of the organic electroluminescence display device 1 shown in FIG. 2. Region III corresponds to a single pixel P in the display region D. The circuit layer 12, the organic electroluminescence light-emitting element 30, the sealing film 40, the filler 45, and the counter substrate 50 are laminated on the substrate 10 in region III.

The circuit layer 12 is a layer in which an electrical circuit for controlling the amount of current flow to each pixel P is orderly disposed. The circuit layer 12 includes, for example, the thin film transistor 11, and a passivation film 13.

The thin film transistor 11 is provided to drive the organic electroluminescence light-emitting element 30, and is provided for each pixel P on the substrate 10. Specifically, the thin film transistors 11 is configured from, for example, a polysilicon semiconductor layer 11a, a gate insulating layer 11b, a gate electrode 11c, a source-drain electrode 11d, a first insulating film 11e, and a second insulating film 11f.

The passivation film 13 is formed so as to cover the thin film transistors 11. By being formed on the thin film transistors 11, the passivation film 13 provides electrical insulation between the adjacent thin film transistors 11, and between the thin film transistor 11 and the organic electroluminescence light-emitting element 30. The passivation film 13 has a contact hole 32a formed for each pixel P to connect the thin film transistor 11 to the organic electroluminescence light-emitting element 30. The passivation film 13 is made of an insulating material, for example, such as $SiO_2$, SiN, acryl, and polyimide. The top surface of the passivation film 13 can be planarized when the passivation film 13 is made of an organic polymer resin such as acryl and polyimide. This makes it easier to form the organic electroluminescence light-emitting element 30.

The configuration of the circuit layer 12 is not limited to this, and may appropriately include other components such as an insulating layer, scan signal lines, video signal lines, power lines, and ground lines.

A reflecting film 31 may be formed in a matrix in a region of the passivation film 13 corresponding to each pixel P. The reflecting film 31 is provided to reflect the emitted light from the organic electroluminescence light-emitting element 30 toward the sealing film 40 side. Desirably, the reflectance of the reflecting film 31 should be made as high as possible, and a metal film of, for example, aluminum or silver (Ag) is used.

For example, more than one organic electroluminescence light-emitting element 30 is formed on the passivation film 13. The organic electroluminescence light-emitting element 30 includes a pixel electrode (anode) 32 controlled by the thin film transistor 11; an organic layer 33 that has at least a light-emitting layer, and is disposed on the pixel electrode 32; and a counter electrode (cathode) 34 formed so as to cover the organic layer 33. With these members, the organic electroluminescence light-emitting element 30 serves as a luminescent source. The present embodiment is described through the case where the pixel electrode 32 and the counter electrode 34 are anode and cathode, respectively. However, the pixel electrode 32 and the counter electrode 34 may be provided as cathode and anode, respectively.

The anode 32 is formed in a matrix, corresponding to each pixel P. The anode 32 is connected to the drain electrode 11d of the thin film transistor 11 via the contact hole 32a. With this configuration, the anode 32 is electrically connected to the driving thin film transistor 11, and the drive current supplied from the thin film transistor 11 is fed to the organic layer 33 via the anode 32.

The anode 32 is made of translucent conductive material. Specifically, for example, ITO (Indium Tin Oxide) is preferably used as material of the anode 32. It is also possible to use other translucent conductive materials, for example, such as IZO (indium zinc oxide), tin oxide, zinc oxide, indium oxide, and aluminum oxide. The anode 32 is in contact with the hole injection layer (described later) of the organic layer 33, and should preferably be made of materials having large work functions.

Note that the reflecting film 31 becomes part of the anode 32 when the reflecting film 31 is made of metal such as silver, and is in contact with the anode 32.

A pixel isolation film 14 is formed between the adjacent anodes 32. The pixel isolation film 14 serves to prevent the adjacent anodes 32 from contacting each other, and to prevent a current leak between the anode 32 and the cathode 34. The pixel isolation film 14 is formed, for example, along the boundary of the adjacent pixels P in planar view, and covers the end portion on the outer periphery of the anode 32. The anode 32 and the organic layer 33 contact each other in the opening of the pixel isolation film 14. The pixel isolation film 14 is made of insulating material, specifically, for example, a photosensitive resin composition.

The organic layer 33 having a light-emitting layer is formed so as to cover the anode 32. The organic layer 33 has a light emitting function. The emitted light may be white, or other colors. The organic layer 33 may be provided for each pixel P, or may be formed so as to cover the whole surface of the pixel P region of the display region D.

The organic layer 33 includes, for example, a hole injection layer, a hole transport layer, a light-emitting layer, an electron transport layer, and an electron injection layer, laminated in this order from the anode 32 side. The laminate structure of the organic layer 33 is not limited to this, and the organic layer 33 is not limited to a specific laminate structure, as long as it includes at least a light-emitting layer.

The light-emitting layer is configured from, for example, an organic electroluminescence material that emits light upon recombination of holes and electrons. For example, such organic electroluminescence material may be a common organic light-emitting material. Specific examples include known fluorescent low-molecular materials that can emit light from the singlet state, for example, such as coumalin, perylene, pyran, anthrone, porphyrin, quinacridone, N,N'-dialkyl-substituted quinacridone, naphthalimide, and N,N'-diaryl-substituted pyrrolopyrrole materials. Known phosphorescent low-molecular materials that can emit light from the triplet state, for example, such as rare-earth metal complex materials also may be used.

The cathode 34 is formed so as to cover the organic layer 33. The cathode 34 is formed so as to cover the whole surface of the pixel P region of the display region D, instead of being independently provided for each pixel P. With this configuration, the cathode 34 is commonly in contact with each organic layer 33 of the organic electroluminescence light-emitting elements 30.

The cathode 34 is made of translucent conductive material. Specifically, for example, ITO is preferably used as material of the cathode 34. It is also possible to use mixtures of conductive metal oxides such as ITO and IZO with metals such as silver and magnesium, or a laminate of a metallic thin film such as silver and magnesium with conductive metal oxides.

The sealing film 40 covers the organic electroluminescence light-emitting elements 30 (the top surface 34a of the cathode 34) over the plurality of pixels P. The sealing film 40 is a protective transparent film provided to prevent entry of oxygen and moisture to the organic layer 33 and other layers. The sealing film 40 of the present embodiment includes a first barrier layer 40a, a base layer 40b, an inter layer 40c, and a second barrier layer 40d.

The first barrier layer 40a serves to prevent entry of oxygen and moisture to the organic electroluminescence light-emitting element 30. The first barrier layer 40a may be made of materials such as SiN, SiON, and SiO. However, the material is not limited to these, provided that it can block moisture and oxygen. The first barrier layer 40a is formed so as to cover the whole surface of the pixel P region of the display region D.

The top surface 40a1 of the first barrier layer 40a is covered with the base layer 40b. The base layer 40b has affinity to the material of the inter layer 40c. The base layer 40b is formed so as to cover the whole surface of the first barrier layer 40a. The base layer 40b may be made of materials, for example, such as a-Si (amorphous silicon), $SiO_2$, and SiO. However, the material is not limited to these, as long as it is lyophilic to the material of the inter layer 40c.

The inter layer 40c is locally formed on the top surface 40b1 of the base layer 40b. The inter layer 40c serves to cover local protruding portions on the top surface 40b1 of the base layer 40b. The configuration of the inter layer 40c is described below in greater detail.

The second barrier layer 40d serves to prevent entry of oxygen and moisture to the organic electroluminescence light-emitting element 30. The second barrier layer 40d may be made of materials such as SiN, SiON, and SiO. However, the material is not limited to these, as long as it can block moisture and oxygen. The second barrier layer 40d is formed so as to cover the whole surface of the pixel P region of the display region D.

Figure 4:
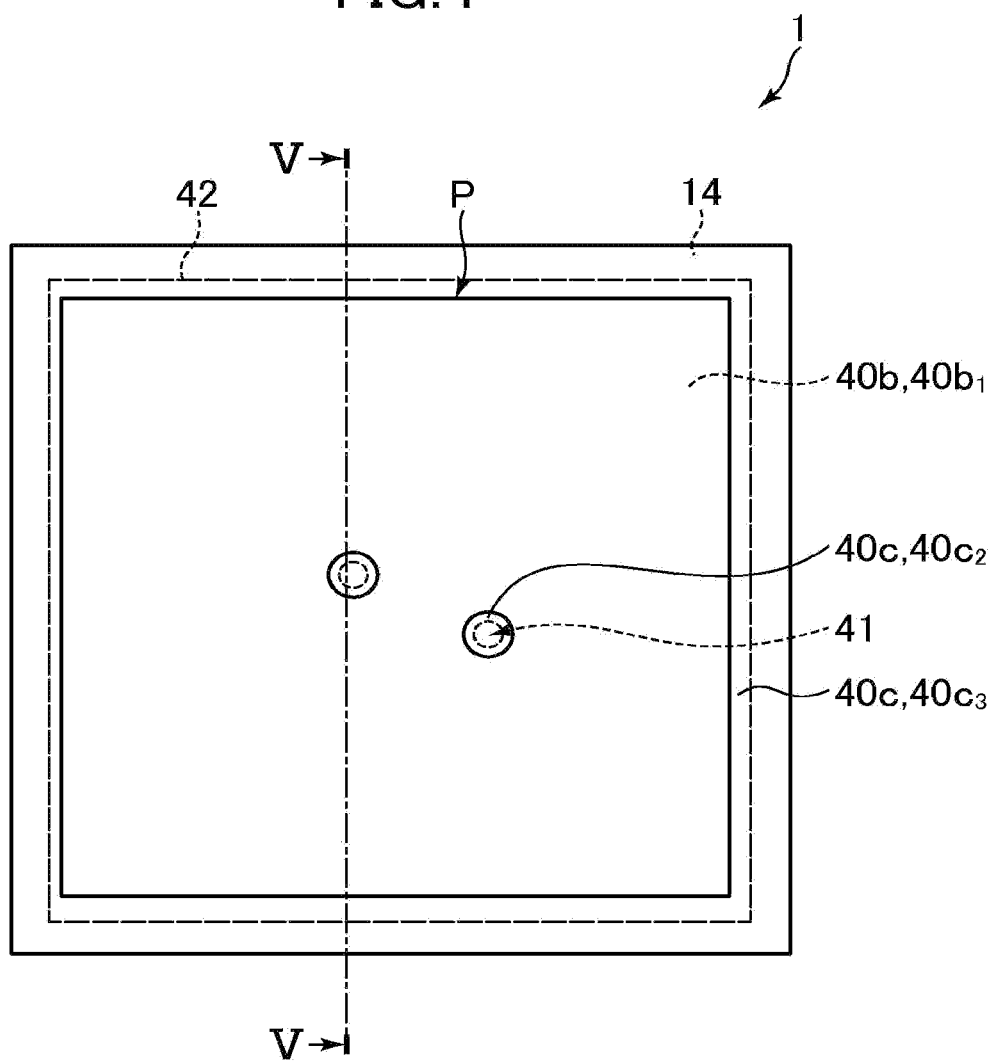
FIG. 4 is a partially magnified view of region IV of the organic electroluminescence display device shown in FIG. 1.
Figure 5:
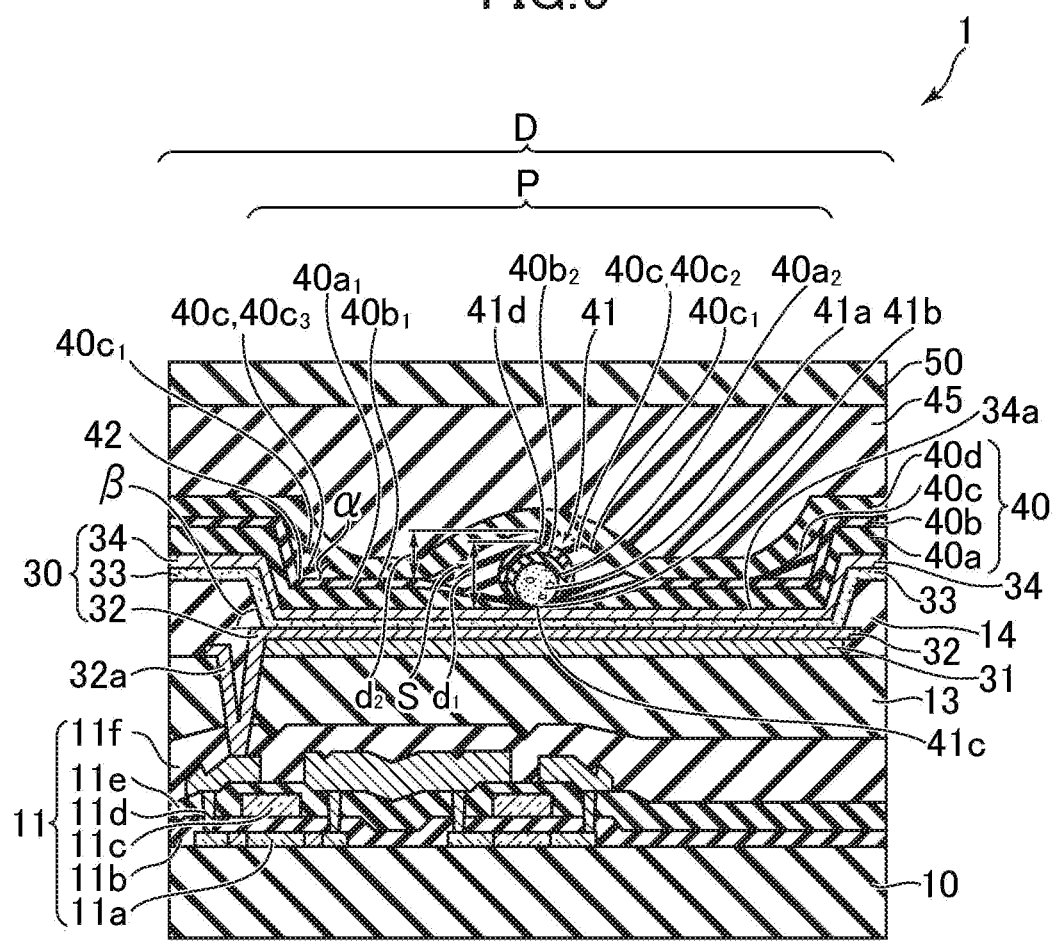
FIG. 5 is a schematic cross sectional view of the organic electroluminescence display device of FIG. 4 at line V-V.

FIG. 4 is a partially magnified view of region IV of the organic electroluminescence display device 1 shown in FIG. 1. FIG. 5 is a schematic cross sectional view of the organic electroluminescence display device 1 of FIG. 4 at line V-V. Referring to FIGS. 4 and 5, the cross section shows the state where the sealing film 40 covers a foreign object 41a such as dust adhering to the cathode 34 provided as the counter electrode in the pixel P region. FIG. 5 depicts an exemplary configuration in which the foreign object 41a forms a local protruding portion 41 when the barrier layer 40a and the base layer 40b are laminated thereon. For convenience of explanation, the counter substrate 50, the filler 45, and the second barrier layer 40d (described later) are omitted in FIG. 4.

As used herein, "protruding portion 41" refers to a raised portion of a height that exceeds the production tolerance specified for the irregularities that occur in the top surface 40b1 of the base layer 40b during the formation of the first barrier layer 40a and the base layer 40b. Specifically, for example, "protruding portion 41" may represent a raised portion formed by a bubble that may occur during the production, or a raised portion formed by the foreign object 41a, for example, dust adhered to the cathode 34, the first barrier layer 40a, or the base layer 40b.

In the embodiment below, the effect of the present invention is described through the case where the foreign object 41a has adhered to the cathode 34. Specifically, the organic electroluminescence display device 1 will be described as having the protruding portion 41. As illustrated in FIG. 5, the portion 41 in the present embodiment is configured from the foreign object 41a, a first barrier layer covering 40a2 (a portion of the first barrier layer 40a covering the foreign object 41a), and a base layer covering 40b2 (a portion of the base layer 40b covering the first barrier layer covering 40a2).

The inter layer 40c covers step S between the portion 41 and the top surface 40b1 of the base layer 40b. The portion of the inter layer 40c covering the step S will be referred to as a first covering portion 40c2. The step S is the difference from a lower portion 41c (the portion of the portion 41 closest to the substrate 10) to an upper portion 41d (the portion of the portion 41 farthest from the substrate 10). The height of the step S is height d1.

The first covering portion 40c2 covers at least the upper portion 41d of the portion 41. The first covering portion 40c2 of the present embodiment covers, for example, the whole surface of the portion 41, and the top surface 40b1 of the base layer 40b over a certain range from the lower portion 41c.

Assume that the height to the top surface 40c1 of the first covering portion 40c2 with respect to the top surface 40b1 of the base layer 40b exposed from the inter layer 40c is height d2. In this case, covering the step S with the first covering portion 40c2 makes the height d2 smaller than the height d1. Specifically, the surface formed by the top surface 40c1 of the inter layer 40c (first covering portion 40c2) and the top surface 40b1 exposed from the inter layer 40c can have better flatness than the surface formed by the top surface 40b1 of the base layer 40b and the protruding portion 41. That is, the inter layer 40c can serve to planarize the underlying irregularities below the inter layer 40c. As a result of forming the inter layer 40c, the film formed on the inter layer 40c is planarized, and fractures caused by the underlying steps and irregularities below the inter layer 40c can be prevented.

In addition to covering the step S, the inter layer 40c may be formed to cover, for example, a corner portion 42 of the top surface 40b1 of the base layer 40b. The corner portion 42 is the boundary between the top surface 40b1 of the base layer 40b in pixel P, and the top surface 40b1 of the base layer 40b on the pixel isolation film 14. When the inter layer 40c covering the corner portion 42 is a second covering portion 40c3, the second covering portion 40c3 is formed on the top surface 40b1, along the inner periphery of the opening of the pixel isolation film 14.

Preferably, the inter layer 40c formed in the plurality of pixels P is separated from one another between the adjacent pixels P. Specifically, for example, the inter layer 40c, including the first covering portion 40c2, the second covering portion 40c3, and an island-shaped inter layer 40c is formed on the top surface 40b1 of the base layer 40b in the pixel P, and these are separated from the inter layer 40c formed in the adjacent pixels P.

Thus, in the emission region, the contact angle α of each inter layer 40c formed on the top surface 40b1 with respect to the top surface 40b1 of the base layer 40b (the angle made by the top surface 40C1 of each inter layer 40c and the top surface 40b1 of the base layer 40b) becomes smaller than 90°. In the present embodiment, "emission region" means a region where the anode 32 and the organic layer 33 are in contact with each other, and that is exposed from the pixel isolation film 14. The contact angle α is also smaller than contact angle β, an angle created between the pixel isolation film 14 and the anode 32. Because the contact angle α is smaller than the contact angle β, the step created by the second barrier layer 40d covering the step formed by the pixel isolation film 14, the anode 32, and the second covering portion 40c3 is more gradual than the step created when the second barrier layer 40d directly covers the corner portion 42. The inter layer 40c may also be formed in any other portions, provided that the inter layer 40c covers at least the step S.

The inter layer 40c is made of an insulator. The material of the inter layer 40c is preferably an organic material, and, specifically, acryl may be used. The material of the inter layer 40c is not limited to acryl. The material of the interlayer 40c is not limited, provided that the affinity between the material of the inter layer 40c and the material of the base layer 40b is higher than the affinity between the material of the inter layer 40c and the material of the second barrier layer 40d (described later). The base layer 40b can have smaller surface energy than the second barrier layer 40d when the inter layer 40c, the base layer 40b, and the second barrier layer 40d are made of materials that satisfy these conditions.

The second barrier layer 40d serves to prevent entry of oxygen and moisture to the inter layer 40c and other layers provided closer to the substrate 10 than the second barrier layer 40d. The second barrier layer 40d is made of SiN, and is formed so as to cover the top surface 40b1 of the base layer 40b, and the top surface 40cl of the inter layer 40c.

The top surface of the sealing film 40 is covered by the counter substrate 50, for example, via the filler 45. The counter substrate 50 is, for example, a glass substrate having a smaller outer perimeter than the substrate 10 in planar view, and is disposed opposite the substrate 10. Specifically, for example, a color filter substrate may be used as the counter substrate 50.

In the organic electroluminescence display device 1 of the embodiment of the present invention, the first covering portion 40c2 covers at least the step S created by protrusion of the portion 41 in the top surface 40b1 of the base layer 40b relative to the top surface 40b1 of the base layer 40b. In this way, the surface formed by the top surface 40c1 of the inter layer 40c (first covering portion 40c2) and the top surface 40b1 exposed from the inter layer 40c can have better flatness than the surface formed by the top surface 40b1 of the base layer 40b and the protruding portion 41, as compared to an organic electroluminescence display device that does not have the foregoing configuration.

Further, because the inter layer 40c is localized, any accidental moisture permeation and diffusion to a part of the inter layer 40c is confined within the local region of the inter layer 40c where the entry of moisture took place. Moisture diffusion through the inter layer 40c can thus be prevented more effectively than in an organic electroluminescence display device that does not have the foregoing configuration. This makes it possible to prevent spread of a detachment region in the interlayer 40c due to moisture diffusion. The organic electroluminescence display device 1 can thus have improved brightness and reliability.

Further, with the second covering portion 40c3 of the inter layer 40c covering the corner portion 42, the top surface 40b1 of the base film 40b in the pixel P forms a gradual step with the top surface 40b1 of the base layer 40b on the pixel isolation film 14. In this way, the second barrier layer 40d can be more uniformly covered inside and outside of the pixel P as compared to an organic electroluminescence display device that does not have the foregoing configuration. This prevents moisture entry to the inter layer 40c, and improves the reliability of the organic electroluminescence display device 1.

Further, because the inter layer 40c formed in the plurality of pixels P is separated from one another between the adjacent pixels P, any accidental moisture entry to a part of the inter layer 40c does not spread to the adjacent pixels P from the pixel P in which the moisture has entered. This makes it possible to more effectively prevent moisture diffusion to the adjacent pixels P than in an organic electroluminescence display device that does not have the foregoing configuration.

When an organic material is used as the material of the inter layer 40c, and the base layer 40b is made of a material having affinity to the organic material, the inter layer 40c preferentially forms at the step S of the portion 41 and the top surface 40b1 of the base layer 40b, the corner portion 42 corresponding to the boundary between the anode 32 and the pixel isolation film 14, and other irregular portions, as opposed to flat portions on the top surface 40b1 of the base layer 40b. Formation of the inter layer 40c can thus be controlled in a manner allowing it to be formed locally in step portions such as in step S, and not formed in flat portions in the pixel P, and in flat portions on the pixel isolation film 14.

Figure 6:
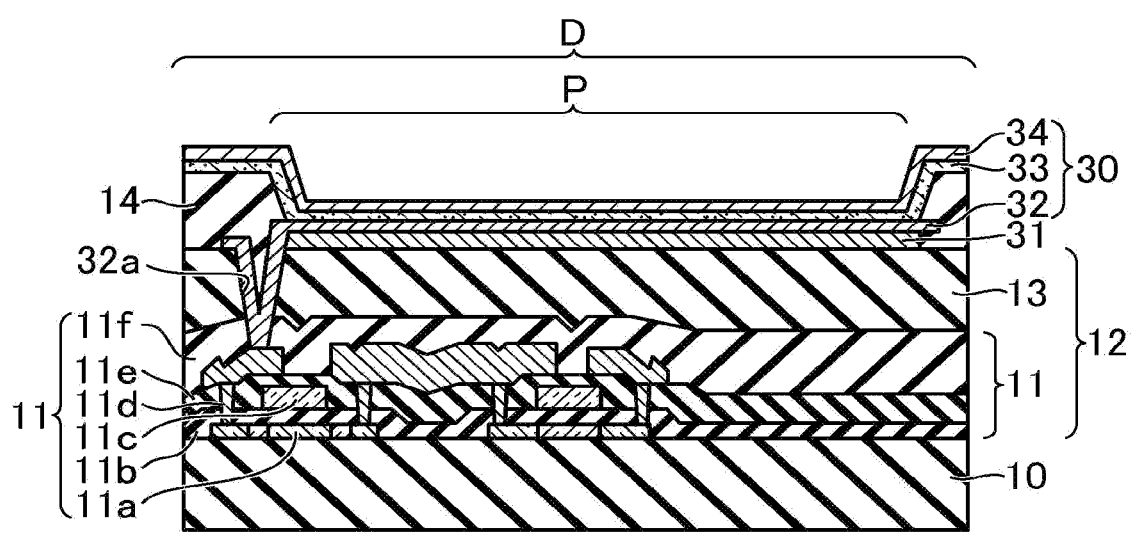
FIG. 6 is a schematic cross sectional view at line V-V, explaining an organic electroluminescence display device manufacturing method according to an embodiment of the present invention.

A manufacturing method of the organic electroluminescence display device 1 according to an embodiment of the present invention is described below with reference to the accompanying drawings. FIG. 6 is a schematic cross sectional view at line V-V, explaining the organic electroluminescence display device manufacturing method of the embodiment of the present invention. The figure depicts a configuration before the sealing film 40 is formed.

The manufacturing method of the organic electroluminescence display device 1 of the present embodiment includes the step of forming the circuit layer 12, the organic electroluminescence light-emitting element 30, the sealing film 40, and the counter substrate 50 on the substrate 10.

First, the insulating substrate 10 is prepared. Thereafter, for example, the polysilicon semiconductor layer 11a, the gate insulating layer 11b, the gate electrode 11c, the source-drain electrode 11d, the first insulating film 11e, and the second insulating film 11f are laminated in the display region D of the substrate 10 to form the thin film transistor 11. This is followed by formation of the circuit layer 12 by forming the passivation film 13 of insulating material over the thin film transistor 11.

The contact hole 32a to be connected to the thin film transistor 11 is then formed in the passivation film 13 and the second insulating film 11f. The metallic reflecting film 31 is then formed on the passivation film 13 in a region corresponding to each pixel P.

Thereafter, the organic electroluminescence light-emitting element 30 is formed for each pixel P on the substrate 10, via the circuit layer 12. The step of forming the organic electroluminescence light-emitting element 30 includes a step of forming the anode 32, a step of forming the organic layer 33 that has at least a light-emitting layer, and a step of forming the cathode 34.

First, the anode 32, made of, for example, a translucent conductive material such as ITO (Indium Tin Oxide), is formed on the passivation film 13 (reflecting film 31) in a region corresponding to each pixel P, using a method, for example, such as sputtering. Upon formation, the anode 32 is electrically connected to the thin film transistor 11 via the contact hole 32a. The reflecting film 31 becomes part of the anode 32 when the anode 32 is formed in contact with the top surface of the metallic reflecting film 31.

The pixel isolation film 14 made of photosensitive insulating material is then formed in a portion of the region between the adjacent pixels P by, for example, photolithography. The pixel isolation film 14 is first deposited over the surface of the display region D. An opening that exposes the top surface of the anode 32 of each pixel P is then formed so as not to expose the end portion of the anode 32 provided as the pixel electrode. As a result, the pixel isolation film 14 is formed that covers the outer periphery of the anode 32 in the form of a bank.

Thereafter, the organic layer 33 having a light-emitting layer is formed on the anode 32. The organic layer 33 is formed, for example, by laminating the hole injection layer, the hole transport layer, the light-emitting layer, the electron transport layer, and the electron injection layer (not illustrated) in order from the anode 32 side. The organic layer 33 may be formed by using known methods, for example, such as a vacuum vapor deposition method, a nozzle printing method, a spin coating method, a slit coating method, an inkjet method, and relief printing.

The cathode 34, made of a translucent conductive material such as ITO, is formed over the organic layer 33 so as to cover the whole surface of the pixel P region of the display region D, using a method, for example, such as sputtering. The cathode 34 formed commonly contacts the organic layer 33 of the organic electroluminescence light-emitting element 30 disposed in each pixel P.

Figure 7:
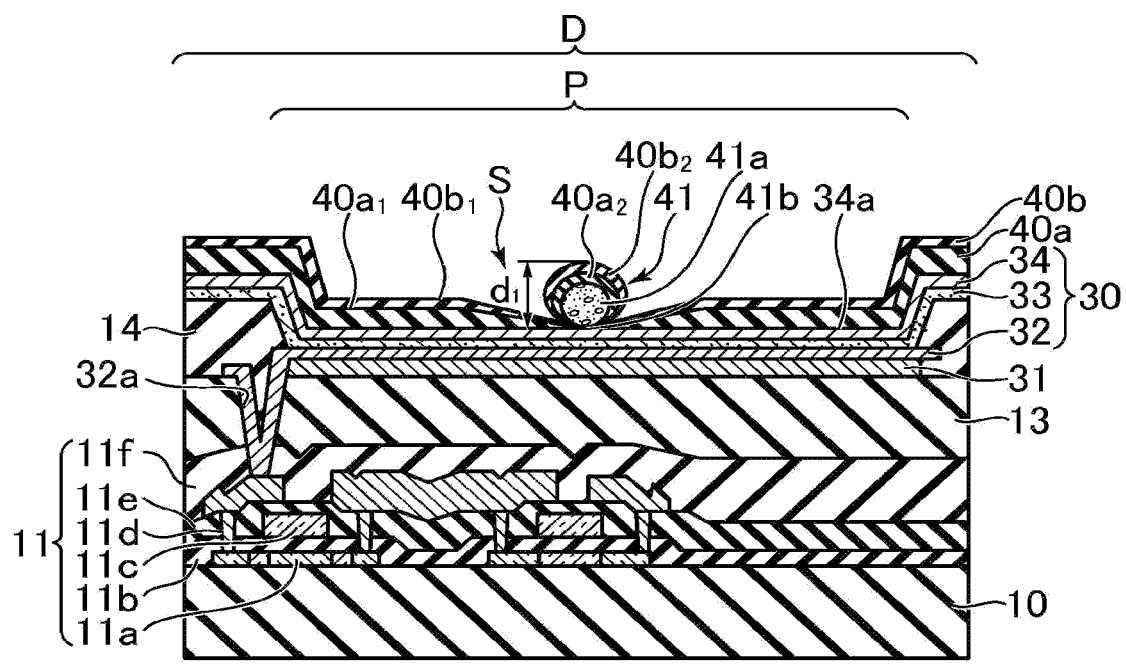
FIG. 7 is a schematic cross sectional view at line V-V, explaining the organic electroluminescence display device manufacturing method according to the embodiment of the present invention.

FIG. 7 is a schematic cross sectional view at line V-V explaining the manufacturing method of the organic electroluminescence display device 1 according to the embodiment of the present invention. In the present embodiment, the step of forming the sealing film 40 is described by using an exemplary configuration in which the foreign object 41a is adhering to the top surface 34a of the cathode 34 in pixel P.

Figure 9:
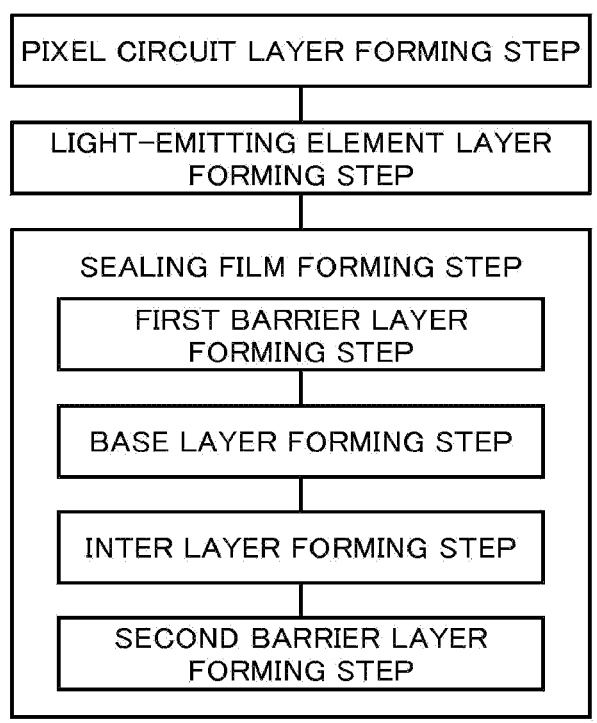
FIG. 9 is a flowchart explaining the organic electroluminescence display device manufacturing method according to the embodiment of the present invention.

The step of forming the sealing film 40 includes a step of forming the first barrier layer 40a so as to cover the organic electroluminescence light-emitting element 30 over the plurality of pixels P, a step of forming the base layer 40b so as to cover the top surface 40a1 of the first barrier layer 40a, and a step of locally forming the inter layer 40c on the top surface 40b1 of the base layer 40b. In the sealing film forming step described below with reference to the flow of FIG. 9, the sealing film 40 is formed in the pixel P region. However, the sealing film 40 may be simultaneously formed also in peripheral region 10a1 where the organic electroluminescence light-emitting element 30 is not formed.

First, the first barrier layer 40a is formed so as to cover the whole surface of the pixel P region of the display region D, using, for example, a plasma CVD method. The method used to form the first barrier layer 40a is not limited to a plasma CVD method, and may be any method selected from, for example, sputtering, vapor deposition, sublimation, CVD (chemical vapor deposition method), ECR-PECVD (electron cyclotron resonance-plasma enhanced chemical vapor deposition method), and a combination of these. Desirably, the first barrier layer 40a is formed by using SiN. A film denser than a $SiO_2$ film can be formed by forming the first barrier layer 40a as a SiN film. In this way, moisture entry from outside can be prevented more effectively than with a barrier layer made from a $SiO_2$ film.

The first barrier layer 40a formed covers the organic electroluminescence light-emitting element 30 (top surface 34a of the cathode 34) and the foreign object 41a over the plurality of pixels P. The portion of the first barrier layer 40a covering the foreign object 41a will be referred to as first barrier layer covering 40a2.

When the portion where the foreign object 41a contacts the top surface 34a of the cathode 34 is a contact surface 41b, the foreign object 41a obstructs the deposition of the first barrier layer 40a on the top surface 34a around the contact surface 41b when the material of the first barrier layer 40a is vapor deposited on the top surface 34a. The first barrier layer 40a thus becomes thinner in a portion covering the top surface 34a around the contact surface 41b than in outer portions, as depicted in FIG. 7.

Thereafter, the base layer 40b of, for example, amorphous silicon is formed so as to cover the top surface 40a1 of the first barrier layer 40a, using a plasma CVD method. The method used to form the base layer 40b is not limited to a plasma CVD method, and may be any method selected from, for example, sputtering, vapor deposition, sublimation, CVD (chemical vapor deposition method), ECR-PECVD (electron cyclotron resonance-plasma enhanced chemical vapor deposition method), and a combination of these. The material of the base layer 40b is not limited to amorphous silicon, and may be, for example, $SiO_2$ or SiO. Other materials also may be used, provided that these are lyophilic to the material of the inter layer 40c.

The base layer 40b formed covers the top surface 40a1 of the first barrier layer 40a, and the first barrier layer covering 40a2. As a result, the protruding portion 41 is formed that is configured from the foreign object 41a, the first barrier layer covering 40a2, and the base layer covering 40b2 (a portion of the base layer 40b covering the first barrier layer covering 40a2).

In the vapor deposition of the material of the base layer 40b on the top surface 40a1, the foreign object 41a and the first barrier layer covering 40a2 obstruct the deposition of the material to the top surface 40a1 around the contact surface 41b. The base layer 40b thus becomes thinner in a portion around the contact surface 41b than in the outer portions.

The protruding portion 41 is not limited to the foregoing configuration, provided that the protruding portion 41 is a raised portion of a height that exceeds the production tolerance specified for the irregularities that occur in the top surface 40b1 of the base layer 40b during the formation of the first barrier layer 40a and the base layer 40b. For example, the protruding portion 41 may be a raised portion formed during the production, including a raised portion due to bubbles, or a raised portion formed by the foreign object 41a, for example, dust adhered to the first barrier layer 40a or the base layer 40b.

Figure 8:
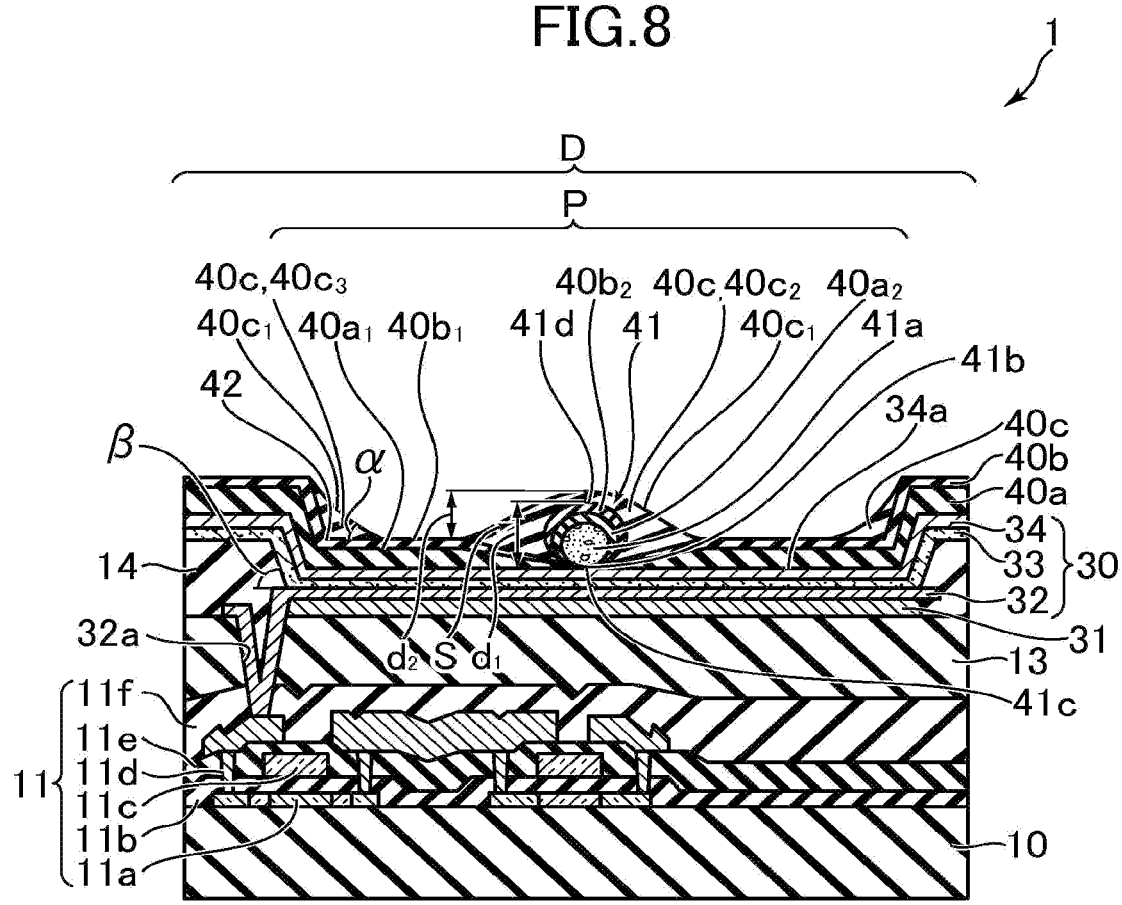
FIG. 8 is a schematic cross sectional view at line V-V, explaining the organic electroluminescence display device manufacturing method according to the embodiment of the present invention.

FIG. 8 is a schematic cross sectional view at line V-V explaining the manufacturing method of the organic electroluminescence display device 1 according to the embodiment of the present invention. The inter layer 40c made of an insulator is locally formed on the top surface 40b1 of the base layer 40b. In the step of forming the inter layer 40c, the deposition of the inter layer 40c is stopped once the inter layer 40c is formed on the step S and the corner portion 42, instead of covering the whole surface of the base layer 40b.

The material of the inter layer 40c is preferably an organic material, particularly preferably acryl. The material of the inter layer 40c is not limited to acryl, and any material may be used, as long as it has higher affinity to the material of the base layer 40b than to the material of the second barrier layer 40d (described later). Further, the material of the inter layer 40c is preferably one that more preferentially adheres to the step S and the corner portion 42 than to the top surface 40b1 of the base layer 40b during the formation of the inter layer 40c.

By using materials satisfying such conditions, the inter layer 40c formed with such materials covers at least the step S created by the portion 41 relative to the top surface 40b1 of the base layer 40b. The portion of the inter layer 40c covering the step S will be referred to as first covering portion 40c2.

Upon forming the inter layer 40c, the first covering portion 40c2 covers at least the upper portion 41d of the portion 41. The first covering portion 40c2 of the present embodiment covers, for example, the whole surface of the portion 41, and the top surface 40b1 of the base layer 40b around the portion 41.

Assume that the height to the top surface 40c1 of the first covering portion 40c2 with respect to the top surface 40b1 of the base layer 40b exposed from the inter layer 40c is height d2. In this case, covering the step S with the first covering portion 40c2 makes the height d2 smaller than the height d1. Specifically, the surface formed by the top surface 40c1 of the inter layer 40c (first covering portion 40c2) and the top surface 40b1 exposed from the inter layer 40c can have better flatness than the surface formed by the top surface 40b1 of the base layer 40b and the protruding portion 41.

In addition to covering the step S, the inter layer 40c may be formed to cover, for example, the corner portion 42 of the top surface 40b1 of the base layer 40b. The corner portion 42 is the boundary between the top surface 40b1 of the base layer 40b in the pixel P, and the top surface 40b1 of the base layer 40b on the pixel isolation film 14. When the inter layer 40c covering the corner portion 42 is a second covering portion 40c3, the second covering portion 40c3 is formed on the top surface 40b1, along the inner periphery of the opening of the pixel isolation film 14.

By covering the protruding portion 41 with the second covering portion 40c3 of the inter layer 40c, the surface formed by the top surface 40c1 of the inter layer 40c and the top surface 40b1 exposed from the inter layer 40c can have better flatness than the surface formed by the top surface 40b1 of the base layer 40b and the protruding portion 41.

Preferably, the inter layer 40c is separated from one another between the adjacent pixels P. Specifically, for example, the inter layer 40c, including the first covering portion 40c2, the second covering portion 40c3, and an island-shaped inter layer 40c are formed on the top surface 40b1 of the base layer 40b in the pixel P, and these are separated from the inter layer 40c formed in the adjacent pixels P.

Thus, the contact angle α of each inter layer 40c formed on the top surface 40b1 with respect to the top surface 40b1 (the angle made by the top surface 40C1 of each inter layer 40c and the top surface 40b1) becomes smaller than 90°. The inter layer 40c may also be formed in any other portions, provided that the inter layer 40c covers at least the step S.

Thereafter, the second barrier layer 40d is formed so as to cover top surface 40b1 of the base layer 40b, and the top surface 40c1 of the inter layer 40c, using, for example, a plasma CVD method. The method used to form the second barrier layer 40d is not limited to a plasma CVD method, and may be selected from any methods. Desirably, the second barrier layer 40d is formed of SiN, as with the case of the first barrier layer 40a. A film denser than a $SiO_2$ film can be formed with the SiN film, and moisture entry from outside can be prevented. The sealing film 40 is formed after these steps.

The wires (not illustrated) formed in the peripheral region 10a1 can be protected by forming the sealing film 40 in the peripheral region 10a1. When the sealing film 40 is formed over the whole surface of the substrate 10, the sealing film 40 may be removed from the connection terminals of the driver 3 and the flexible circuit board 2 after the formation. In this way, the connection terminals can be formed in regions where the sealing film 40 was removed.

Thereafter, the counter substrate 50 is disposed on the sealing film 40 via the filler 45 to form the organic electroluminescence display device 1 shown in FIG. 5. The present embodiment has been described through the configuration in which the protruding portion 41 is formed on the top surface 40b1 of the base layer 40b in pixel P. However, because the protruding portion 41 is a foreign object, it is desirable not to have the protruding portion 41 in the pixel P. When there is no foreign object, the inter layer 40c is formed along the corner portion 42, and planarizes the top surface 40C1 in the pixel P region, as shown in FIG. 3.

In the manufacturing method of the organic electroluminescence display device 1 of the embodiment of the present invention, the inter layer 40c is formed on the base layer 40b, and the first covering portion 40c2 covers the step S created by protrusion of the portion 41 in the top surface 40b1 of the base layer 40b relative to the top surface 40b1 of the base layer 40b. In this way, the surface formed by the top surface 40c1 of the inter layer 40c (first covering portion 40c2) and the top surface 40b1 exposed from the inter layer 40c can have better flatness than the surface formed by the top surface 40b1 of the base layer 40b and the protruding portion 41, as compared to an organic electroluminescence display device manufacturing method that does not have the present configuration.

Further, because the inter layer 40c is localized, any accidental moisture permeation and diffusion to a part of the inter layer 40c is confined within the local region of the inter layer 40c where the entry of moisture took place. The organic electroluminescence display device 1 can thus prevent moisture diffusion through the inter layer 40c, and detachment due to moisture permeation more effectively than an organic electroluminescence display device produced by a manufacturing method that does not have the present configuration. The organic electroluminescence display device 1 can thus have improved brightness and reliability. The yield of the organic electroluminescence display device 1 also can be improved.

Further, with the second covering portion 40c3 of the inter layer 40c formed along the corner portion 42, the angle α made by the slope of the top surface of the second barrier layer 40d at the slanted surface of the pixel isolation film 14 becomes smaller than the angle β made by the slope of the top surface of the first barrier layer 40a at the slanted surface of the pixel isolation film 14. Specifically, the angle α created by the top surface 40c1 of the inter layer 40c (second covering portion 40c3) covering the corner portion 42 with respect to the top surface 40b1 of the base layer 40b becomes smaller than the angle § created by the slanted surface of the pixel isolation film 14 and the top surface of the anode 32. Accordingly, the step created by the second barrier layer 40d covering the step configured from the pixel isolation film 14, the anode 32, and the second covering portion 40c3 becomes more gradual than the step created by the second barrier layer 40d directly covering the corner portion 42. In this way, the second barrier layer 40d can be more uniformly covered inside and outside of the pixel P as compared to an organic electroluminescence display device manufacturing method that does not have the present configuration, and can be prevented from fracture due to the step. This makes it possible to prevent moisture entry to the inter layer 40c, and improve the reliability of the organic electroluminescence display device 1.

Further, because the inter layer 40c formed is separated from one another between the adjacent pixels P, any accidental moisture entry to a part of the inter layer 40c does not spread to the adjacent pixels P from the pixel P in which the moisture has entered. The organic electroluminescence display device 1 can thus more effectively prevent moisture diffusion to the adjacent pixels P as compared to an organic electroluminescence display device produced by a manufacturing method that does not have the present configuration.

Further, by forming the inter layer 40c with an organic material, the affinity between the material of the base layer 40b and the material of the inter layer 40c can be increased more than in an organic electroluminescence display device manufacturing method that does not have the present configuration. This eliminates the need to form the inter layer 40c over the whole surface of the inter layer 40b. Thus, it becomes easier to locally form the inter layer 40c, and more effectively prevent moisture diffusion.

Figure 10:
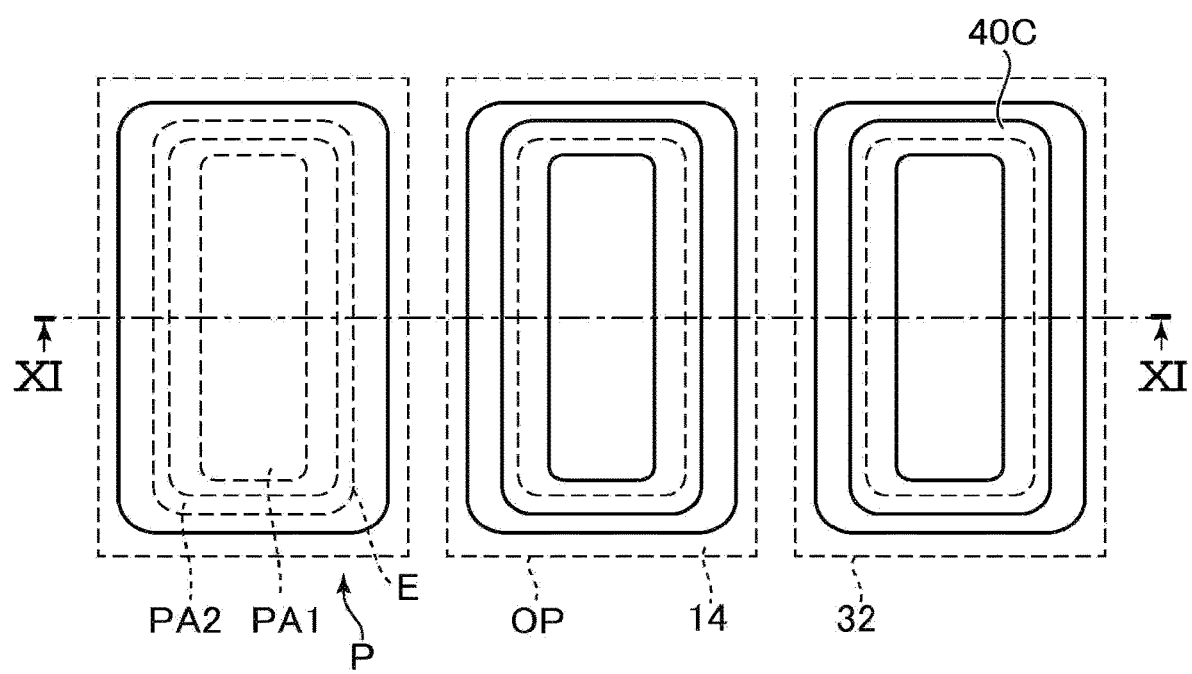
FIG. 10 is a plan view of a pixel section of the organic electroluminescence display device of the embodiment of the present invention.
Figure 11:
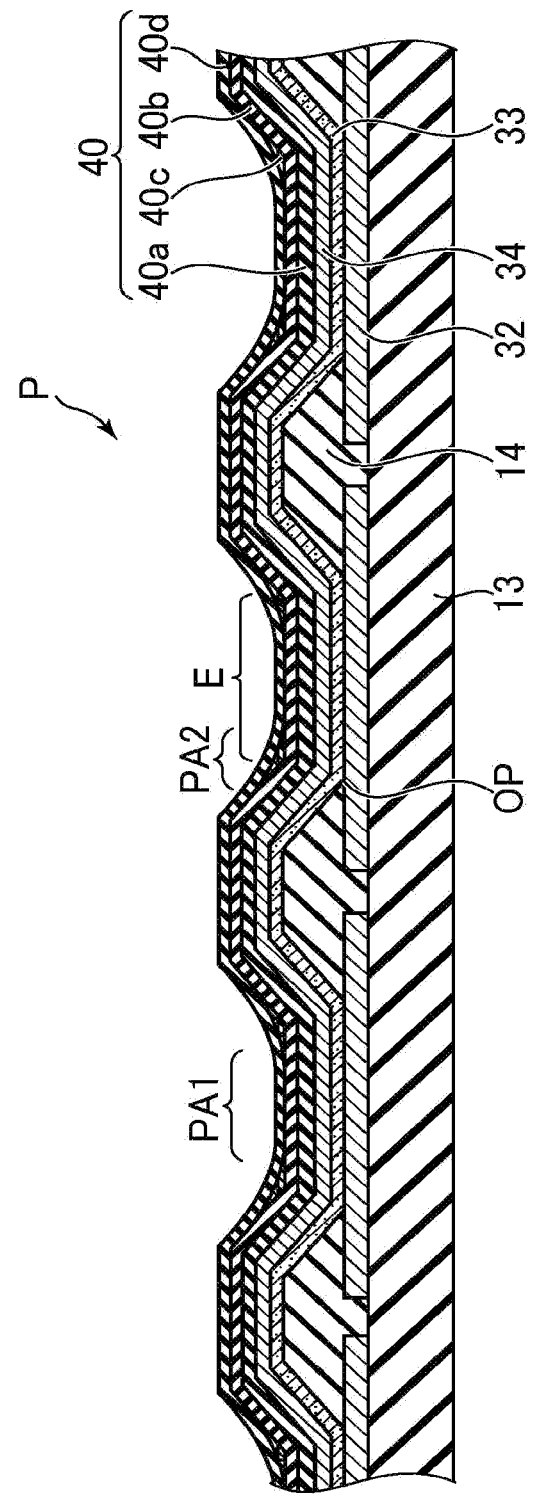
FIG. 11 is a schematic cross sectional view of the organic electroluminescence display device of FIG. 10 at line XI-XI.

FIG. 10 is a plan view of pixels P of the organic electroluminescence display device 1 according to the embodiment of the present invention. FIG. 11 is a schematic cross sectional view taken at line XI-XI of FIG. 10. For convenience of explanation, FIG. 11 only shows the configuration from the passivation film 13 to the sealing film 40.

The organic electroluminescence display device shown in FIGS. 10 and 11 have the same configuration as that described with reference to FIG. 3. Specifically, the pixel formed on the substrate includes a thin film transistor 11, a pixel electrode (anode) 32 controlled by the thin film transistor 11, an organic layer 33 disposed on the anode 32, and a counter electrode (cathode) 34 disposed on the organic layer 33. Accordingly, these constituting elements will not be described.

The pixel P formed for each pixel electrode 32 is covered with the common sealing film 40. The sealing film 40 on the pixels P includes a first region PA1 where the first barrier layer 40a, the base layer 40b, and the second barrier layer 40d are laminated, and a second region AP2 where the first barrier layer 40a, the base layer 40b, the inter layer 40c, and the second barrier layer 40d are laminated.

The first region PA1 overlaps the emission region of the pixel P. The second barrier layer 40d is directly laminated on the base layer 40b in the first region PA1, and the second barrier layer 40d more strongly adheres to the base layer 40b than in a display device that does not have the present configuration. The second barrier layer 40d can thus be prevented from being detached from the base layer 40b. The second region PA2 is formed over an area from a part of the emission region of the pixel P to a region overlapping a part of the pixel isolation film 14 provided as an insulating film.

As illustrated in FIG. 10, the first region PA1 is surrounded by the second region PA2 in planar view, and the inter layer 40c is not formed in a central portion of the emission region (the region of the organic layer 33 sandwiched between the anode 32 and the cathode 34 in contact therewith) E. The emission region E can thus have a smaller area of the inter layer 40c region than in an organic electroluminescence display device of related art in which the inter layer 40c is formed throughout the emission region E. This makes it possible to suppress attenuation of the emitted light from the organic layer 33, and the organic electroluminescence display device 1 can have improved luminance.

In the embodiment of the present invention, the localized formation of the inter layer 40c is made possible by the base layer 40b made of a material having affinity to the inter layer 40c and provided on the first barrier layer 40a. The inter layer 40c thus more preferentially forms on the step S and the corner portion 42 than on the flat regions, and can be selectively formed only on the step S and the corner portion 42.

In the organic electroluminescence display device 1 of the present embodiment, the sealing film 40 can have more desirable adhesion and sealing performance than in an organic electroluminescence display device that does not have the present configuration. This makes it possible to suppress detachment of the sealing film 40, and improve the viewability and the coupling-out efficiency of the organic electroluminescence display device 1.

EXAMPLES

The organic electroluminescence display device 1, and the manufacturing method thereof according to the embodiment of the present invention are described below in greater detail using Examples. It should be noted that the present invention is not limited by the following Examples.

Example 1

First, the circuit layer 12 was formed on the insulating substrate 10, followed by formation of the anode 32, the pixel isolation film 14, the organic layer 33 having at least a light-emitting layer, and the cathode 34. As a result, the organic electroluminescence light-emitting element 30 was formed for each pixel P, as shown in FIG. 6.

Thereafter, the first barrier layer 40a, made of SiN and having a thickness of 500 nm, was formed on the organic electroluminescence light-emitting element 30 (on the cathode 34) by using a plasma CVD method with $SiH_4$, $NH_3$, and $N_2$ gas materials, as shown in FIG. 7. The substrate temperature was brought to 100° C. or less during the deposition of the first barrier layer 40a.

The base layer 40b, made of amorphous silicon and having a thickness of 2 nm, was then formed so as to cover the top surface 40a1 of the first barrier layer 40a, using a plasma CVD method with a $SiH_4$ gas material. The substrate temperature was brought to 100° C. or less during the deposition of the base layer 40b.

Thereafter, acryl was applied to the top surface 40b1 of the base layer 40b. The applied acryl locally covered only the protruding portion 41 and the corner portion 42. The acryl was then polymerized by UV irradiation to form the inter layer 40c shown in FIG. 8.

The second barrier layer 40d, made of SiN and having a thickness of 500 nm, was then formed so as to cover the top surface 40b1 of the base layer 40b and the top surface 40c1 of the inter layer 40c, using a plasma CVD method with $SiH_4$, $NH_3$, and $N_2$ gas materials. The substrate temperature was brought to 100° C. or less during the deposition of the second barrier layer 40d. The sealing film 40 was formed after these steps.

Thereafter, the counter substrate 50 was bonded to the sealing film 40 after being coated with a 6 μm-thick sealant BM and the filler 45. This completed the organic electroluminescence display device 1 shown in FIG. 5.

The organic electroluminescence display device 1 obtained in the example was tested in an 85° C., 85% humidity atmosphere. The observed result did not show any sign of spread of dark spots in the emission region, or delamination of the sealing film 40 due to moisture entry into the sealing film 40. It was thus confirmed that moisture diffusion from the point of moisture entry in the sealing film 40 was suppressed.

Comparative Example 1

The inter layer 40c was formed so as to cover the top surface 40a1 of the first barrier layer 40a, without forming the base layer 40b. The inter layer 40c formed covered the whole surface of the pixel P region of the top surface 40a1. The organic electroluminescence display device was completed in the same manner as in Example 1.

The organic electroluminescence display device 1 obtained in the comparative example was tested in an 85° C., 85% humidity atmosphere. The observed result showed signs of spread of dark spots in the emission region, and delamination of the sealing film 40 due to moisture entry into the sealing film 40. It was thus confirmed that moisture diffusion occurred from the point of moisture entry in the sealing film 40.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   an insulating substrate;
   a circuit layer disposed on the insulating substrate;
   an anode disposed on the circuit layer;
   a pixel isolation film formed on the anode;
   an organic layer having light emitting element disposed on the pixel isolation film;
   a cathode covering the organic layer; and
   a sealing film covering the cathode,
   wherein
   the circuit layer includes a thin film transistor and a passivation film covering the thin film transistor,
   the pixel isolation film covers an edge portion of the anode and has a contact hole exposing a part of the anode,
   the organic layer is in contact with the anode through the contact hole,
   the sealing film includes a first barrier layer, a base layer on the first barrier layer, an interlayer on the base layer, and a second barrier layer on the interlayer,
   the first barrier layer includes silicon nitride or silicon oxynitride,
   the base layer includes silicon oxide or amorphous silicon and is in contact with the first barrier layer,
   the interlayer is made of organic material and is sandwiched between the base layer and the second barrier layer,
   the second barrier layer includes silicon nitride or silicon oxynitride,
   the base layer has a flat surface corresponding to an area where the organic layer is in contact with the anode and an inclined surface corresponding to the contact hole of the pixel isolation film,
   the interlayer is disposed on a boundary portion between the flat surface and the inclined surface, and
   the second barrier layer is in contact with the base layer at the flat surface within the contact hole.

2. The display device according to claim 1, wherein the sealing film includes:
   a first region where the first barrier layer, the base layer, and the second barrier layer are laminated and the second barrier layer is in direct contact with the base layer, and
   a second region where the first barrier layer, the base layer, the interlayer, and the second barrier layer are laminated.

3. The display device according to claim 1, wherein a filler is disposed on the sealing film, and a second substrate is disposed on the filler.

* * * * *